US011953577B1

(12) United States Patent
Evans et al.

(10) Patent No.: US 11,953,577 B1
(45) Date of Patent: Apr. 9, 2024

(54) METERING COMPONENT TESTING (71) Applicant: Lunar Energy, Inc., Mountain View, CA (US)

(72) Inventors: Kyle Breuning Evans, Auburn, CA (US); Sebastian Wolf, London (GB)

(73) Assignee: Lunar Energy, Inc., Mountain View, CA (US)

( * ) Notice: Subject to any disclaimer, the term of this patent is extended or adjusted under 35 U.S.C. 154(b) by 0 days.

(21) Appl. No.: 18/212,926

(22) Filed: Jun. 22, 2023

(51) Int. Cl.
*G01R 35/04* (2006.01)
*G01R 22/06* (2006.01)

(52) U.S. Cl.
CPC ........... *G01R 35/04* (2013.01); *G01R 22/065* (2013.01)

(58) Field of Classification Search
CPC ...... G01R 22/00; G01R 22/06; G01R 22/065; G01R 35/04; H02S 50/00; H02S 50/10
See application file for complete search history.

(56) References Cited

U.S. PATENT DOCUMENTS

| | | | | |
|---|---|---|---|---|
| 7,622,912 | B1 * | 11/2009 | Adams | G01R 21/133 307/64 |
| 9,625,559 | B2 * | 4/2017 | Fahrenbruch | G01R 35/04 |
| 11,699,973 | B2 * | 7/2023 | Fischer | H02S 40/36 361/93.1 |
| 2011/0309820 | A1 * | 12/2011 | Khanke | G01R 35/04 324/74 |
| 2013/0123998 | A1 * | 5/2013 | King | H02J 13/00006 700/292 |
| 2015/0340868 | A1 * | 11/2015 | Chapman | H02M 7/44 307/82 |
| 2018/0321350 | A1 * | 11/2018 | Marshall | G01R 35/005 |
| 2019/0310292 | A1 * | 10/2019 | Scrutchfield | G01R 22/068 |

\* cited by examiner

*Primary Examiner* — Huy Q Phan
*Assistant Examiner* — David B Frederiksen
(74) *Attorney, Agent, or Firm* — Van Pelt, Yi & James LLP (57) ABSTRACT

In various embodiments, a process for performing metering component testing includes obtaining a configuration associated with at least one metering component installed at a site to be metered and performing a metering component test. The metering component test includes at least one of: detecting phase assignment of the at least one metering component based at least on the configuration, and detecting polarity of the at least one metering component based at least on the configuration. The process includes outputting information associated with the metering component test.

20 Claims, 8 Drawing Sheets

METERING COMPONENT TESTING

BACKGROUND OF THE INVENTION

Field installed accessory metering components can be used to meter loads. Some loads can be monitored by using a component that measures current. However, the installation of metering components can be a major cause of errors. For example, the installer might install the components backwards or keep track of the components incorrectly. Conventionally, installers troubleshoot and determine how to fix the errors manually. Thus, there is a need to test metering components, e.g., to detect and correct errors.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The installation of the accessory metering components can be a cause of installation errors because it is challenging for the installer to keep track of or otherwise identify which metering component is on which line. For example, an installation error happens when an installer installs the component with the wrong polarity. Conventionally, field installed accessory metering components are simply flagged and require an installer to troubleshoot and determine how to fix the errors. By contrast, performing the disclosed phase and polarity test allows automatic corrections in software to be made.

Figure 1:
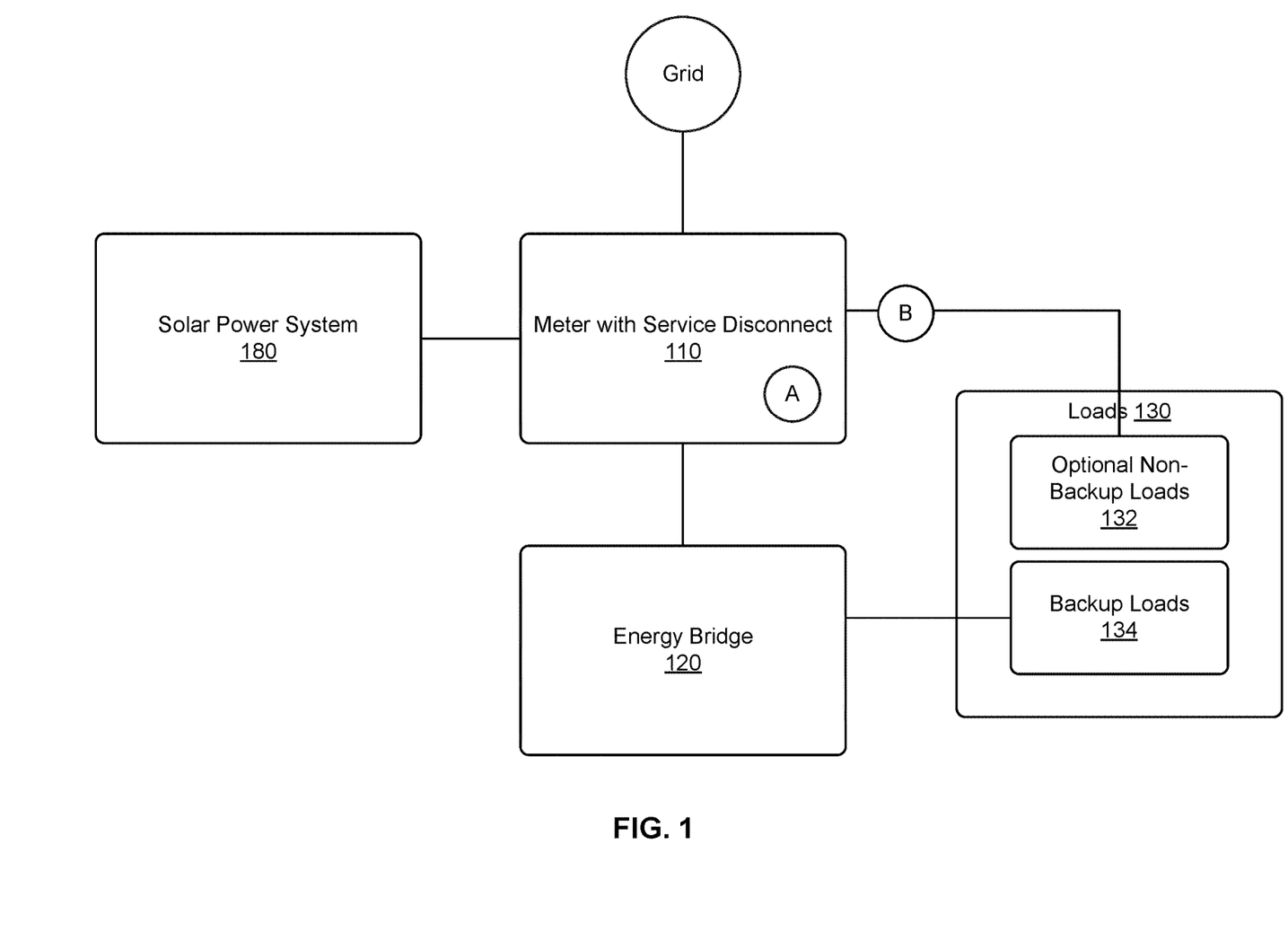
FIG. 1 is a block diagram illustrating an embodiment of a system with service disconnect at a utility meter.

FIG. 1 is a block diagram illustrating an embodiment of a system with service disconnect at a utility meter. The system includes a solar power system 180, a meter with service disconnect 110, an energy bridge 120, and loads 130. An example of the solar power system is further described with respect to FIG. 7.

The loads 130 may include one or more including backup loads 134 and one or more non-backup loads 132. As described herein, metering non-backup loads 132 and backup loads 134 allows on grid metering and whole home metering to be provided. Correspondingly, time-of-use load shifting can be performed. Non-backup loads 132 are typically monitored by field wiring a component that current measuring device such as a Rogowski coil The accessory metering component can be installed in various locations. For example, the component can be installed at location B to directly measure the non-backup loads 132. As another example, the component can be installed at location A (the main breaker) to measure the entire site (rather than only the loads 130). In various embodiments, the accessory metering component is expected to be installed at location A.

Although for simplicity only single lines are shown between the solar power system 180, the meter with service disconnect 110, the energy bridge 120, and the loads 130, in various embodiments, there are multiple lines between the components. One example is a pair of lines L1 (line 1) and L2 (line 2) that runs between each component. A metering component can be installed on each line. However, it is challenging for the installer to keep track of or otherwise identify which metering component is on which line. For example, a current sensor is installed on each of the lines to measure current on L1 and current on L2. However, the installer does not know whether a first current sensor corresponds to (is measuring) current on L1 and a second current sensor corresponds to (is measuring) current on L2 or vice versa. However, a controller (e.g., 114) needs correct information about which line a current sensor is reading to perform various operations. For example, having the correct measurement of current on each line allows power to be determined (e.g., by multiplying the current by the correct voltage).

Installation errors can be reduced by performing the disclosed phase and polarity test and making corrections.

For example, the phase and polarity of the Rogowski coils are detected, and adjustments are made in software so that the installer does not have to change anything physically about how they installed the device. In other words, the device can be installed (e.g., plugged in) in a variety of ways (e.g., with a lot of incorrectness) and the system will automatically make corrections.

The presence, phase, and polarity tests further described herein can be performed to determine which accessory metering component is on which line and to make adjustments (e.g., software adjustments) if needed so that the controller receives correct information. This does not add burden on the installer because the installer does not need to keep track of which component is on which line. For example, the installer can simply plug in any component on any line without needing to keep track of which one was placed on L1 and which one was placed on L2. The phase and polarity test can be performed to determine which component is on which line.

Another installation error happens when an installer installs the component with the wrong polarity. For example, on a Rogowski coil, there is typically an arrow indicating which way is positive and which way is negative. However, it can be confusing whether the arrow is supposed to point to the source or if the arrow is supposed to point in the direction of current flow. Consequently, the installer might install the coil backwards.

The correct polarity information can be used by the solar power system in a variety of ways. In one aspect, correct information about which direction power is flowing is need to a power flow diagram of the site. In another aspect, the polarity information can be used to discharge the inverter to cover loads. However, keeping track of polarity can be challenging for an installer. For example, when the site includes a main grid, loads, AC coupled PV, and an inverter, what to assign positive and negative can become confusing for the installer. As further described with respect to FIG. 5, a polarity check portion of the phase and polarity test checks for polarity. The polarity test determines polarity and therefore the installer no longer needs to keep track. Unlike conventional systems, which may require the installer to re-install or correct the component, the disclosed techniques do not require an installer to do that. Instead, after determining the correct polarity, the system updates the polarity value in software so the device does not need to be physically flipped.

A polarity and phase test may include one or more of the following: determining the quantity of components installed, determining phase (e.g., which component is on L1 vs. L2), and determining polarity of a component (e.g., positive vs. negative), as further described in the following figures. For simplicity, the processes of FIGS. 2-5 are described using Rogowski coils, but this is not intended to be limiting as the process can be applied to other types of components.

In various embodiments, test results can be used to automatically make corrections to the field installed accessory metering components. Field installed accessory metering components can be used to meter whole-home loads or non-backup loads. Metering non-backup loads (in addition to backup loads) allows on grid metering and whole home metering to be provided, and time-of-use load shifting can be performed. Loads are typically monitored by field wiring a component that measures current such as a Rogowski coil or an iron core current transformer.

Figure 2:
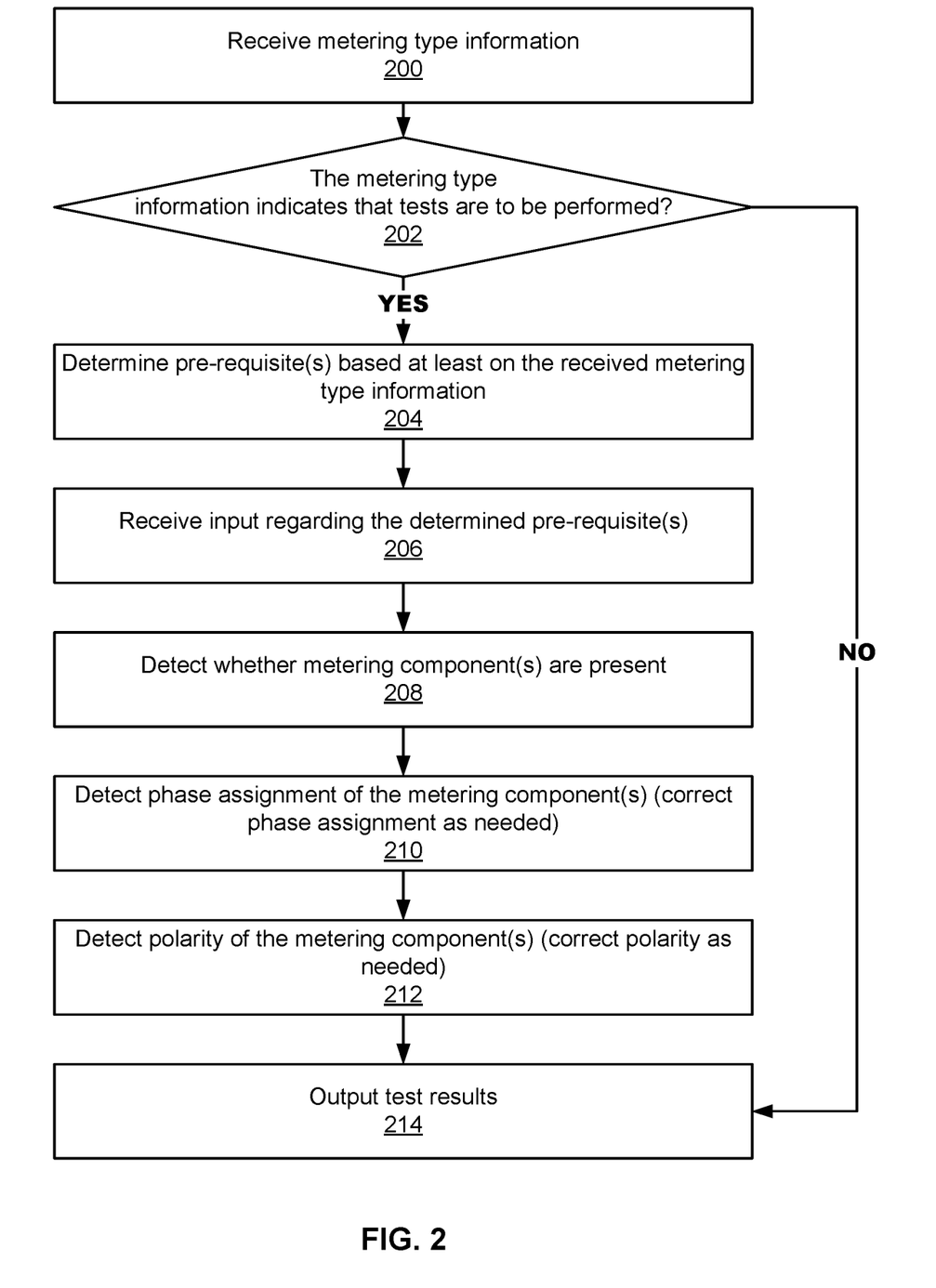
FIG. 2 is a flow diagram illustrating an embodiment of a process of performing a metering test.

FIG. 2 is a flow diagram illustrating an embodiment of a process of performing a metering test. The process can be performed by a configuration application 702 in cooperation with controller 714 of FIG. 1 or processor 802 of FIG. 8. In various embodiments, the process is initiated via a user interface such as the one shown in FIG. 6B by selecting the "metering configuration" test.

In this example, the process begins by receiving metering type information (200). In various embodiments, an installer is invited to input the metering type used via a commissioning app. For example, the installer may describe the system and metering configuration such as: whole home backup with no coils, partial home backup with coils on main, etc. The metering input installed can be used to determine quantities being metered and whether coils are required/have been fitted. Based on this information, metering tests can be performed or skipped. For example, in response to installer input that metering is for the whole home with no coils, a results screen may display "no coils fitted." If metering is partial home with coils on a main breaker, the metering test begins. If another scenario applies, a results screen is displayed in "edit" mode to allow the installer to describe their settings.

Table 1 shows some coil scenarios and validation (test) results. In various embodiments, some scenarios are not allowed because they lead to incorrect metering.

TABLE 1

| Scenario | Bridge Measuring | Coils fitted | Coils measuring | Validation |
|---|---|---|---|---|
| Whole home, no coils | Whole home | No | — | Valid |
| Whole home, coils without role | Whole home | Yes | — | Error |
| Whole home for both | Whole home | Yes | Whole home | Error |
| Whole home, coils on non-backup | Whole home | Yes | Non-backup | Error |
| Whole home, coils on EVSE in Backup | Whole home | Yes | EVSE in Backup | Valid |
| Whole home, coils on external EVSE | Whole home | Yes | EVSE out of Backup | Error |
| Partial home, no coils | Backup | No | — | Error |
| Partial home, coils without role | Backup | Yes | — | Error |
| Partial home, coils on whole home | Backup | Yes | Whole home | Valid |
| Partial home, coils on non-backup | Backup | Yes | Non-backup | Valid |
| Partial home, coils on EVSE in backup | Backup | Yes | EVSE in Backup | Error |
| Partial home, coils on EVSE out of backup | Backup | Yes | EVSE out of Backup | Valid |

The process determines whether the metering type information indicates that tests are to be performed (202). If tests do not need to be performed, then process proceeds to 212 where test results are output (e.g., pass). The process can make the determination using a lookup table of scenarios. Referring to Table 1, if the metering type information corresponds to a scenario with validation "valid," then tests do not need to be performed. For example, "whole home, no coils" indicates that tests do not need to be performed.

If the metering type information indicates that tests are to be performed, the process proceeds to determine pre-requisites based at least on the received metering type information (204). Example pre-requisites include coils fitted if scenario needs it and coils fitted as required; any loads turned on as required; system ready to be energized. The determined pre-requisites may be output for installer review. For example, the commissioning application displays pre-requisites for review. The process receives input regarding the determined pre-requisites (206). For example, the installer confirms pre-requisites are met and configuration is correct.

Figure 3:
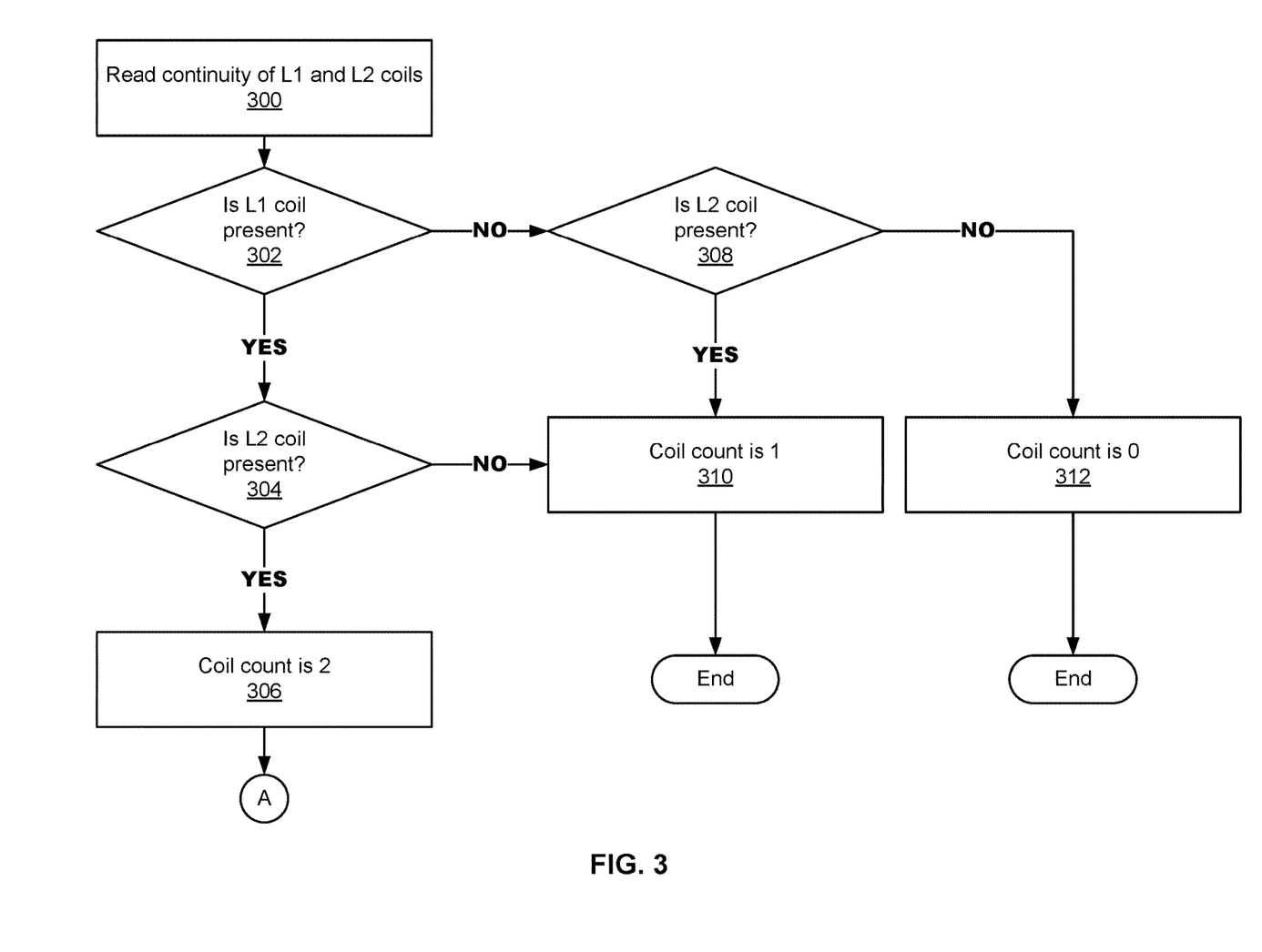
FIG. 3 is a flow diagram illustrating an embodiment of a process for checking for metering component presence.

The process detects whether metering components are present (208). The process detects continuity of field-wired external coils. In various embodiments, this portion of the test is successful if two coils are detected. If one coil or zero coils are detected, the installer is invited to describe their configuration manually in various embodiments. An example of detecting the presence of metering components is shown in FIG. 3.

Figure 4:
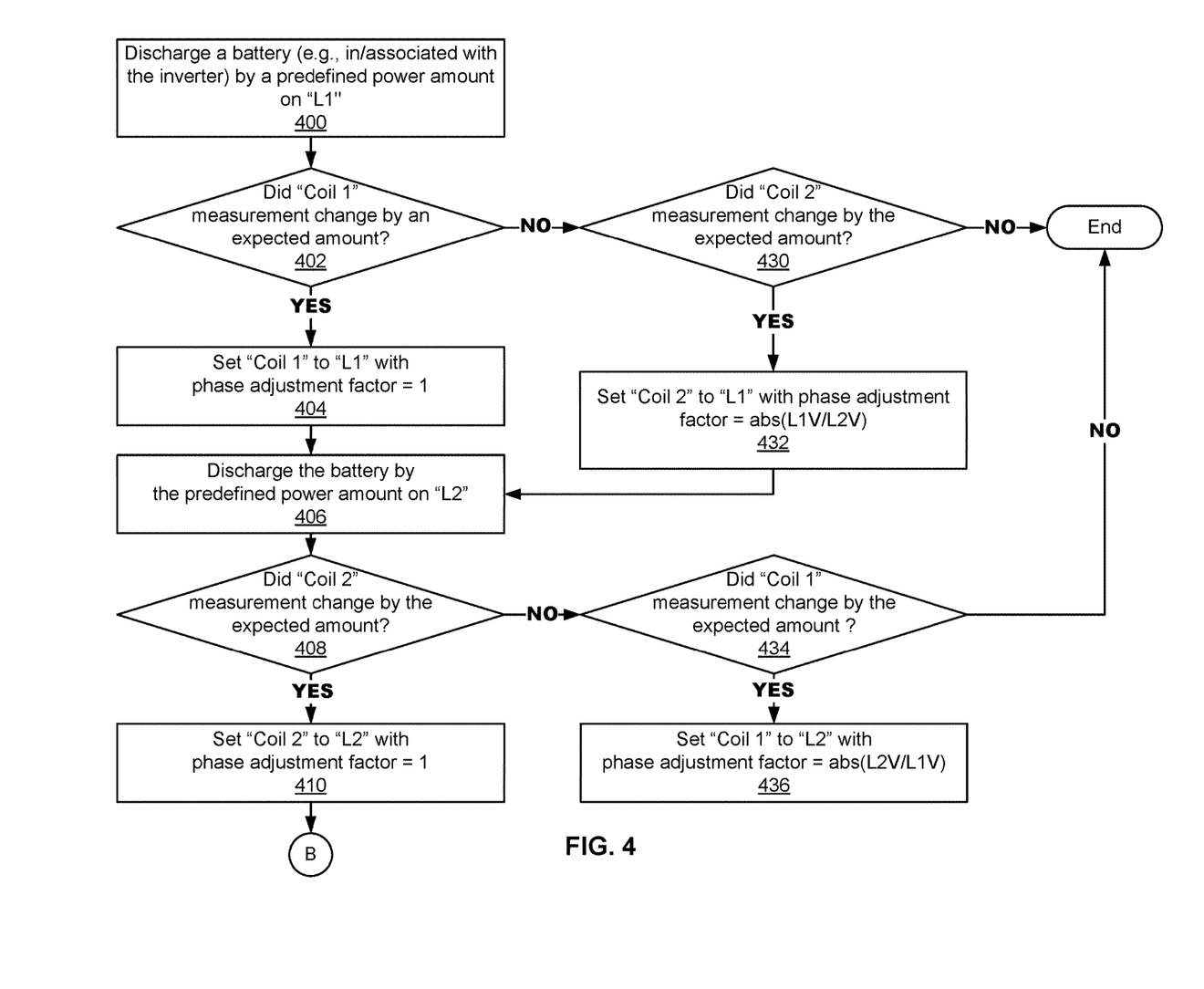
FIG. 4 is a flow diagram illustrating an embodiment of a process for detecting phase assignment of a metering component.

The process detects phase assignment of the metering components (and optionally corrects the phase assignment as needed) (210). In various embodiments, the inverter is discharged by a predefined amount (e.g., 1 kW) down each phase, the process measures which coil read the change, and if the reading was within +/−5% of expected power. In various embodiments, this portion of the test is successful if discharges are detected on each coil in turn, and metered power is within a threshold (e.g., 5%) of discharged power. The detected phases are assigned to the coils. However, the test is unsuccessful if discharges are not detected on each coil or metered power is outside of the threshold. In various embodiments, in the case of test failure, the process assumes a default configuration and outputs a results screen in edit mode. An example of detecting phase assignment is shown in FIG. 4.

Figure 5:
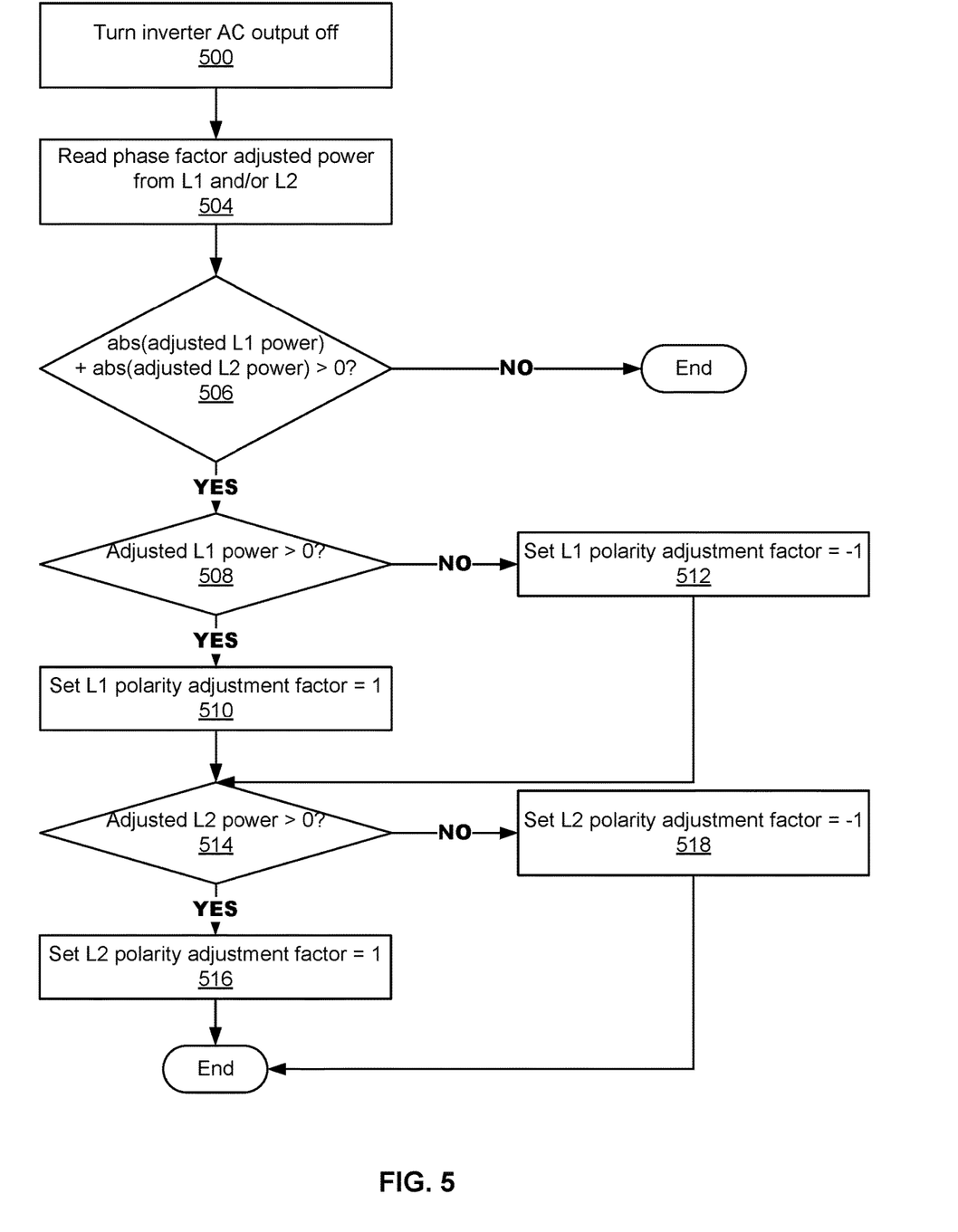
FIG. 5 is a flow diagram illustrating an embodiment of a process for detecting polarity of a metering component.

The process detects polarity of the metering components (and optionally corrects the polarity as needed) (212). In various embodiments, the process turns off inverter AC production, measures polarity of power on L1 and L2, and corrects coil polarity assignment if inverted. In various embodiments, this portion of the test is successful if metered power is non-zero, and polarity of coils can be inferred. The detected polarity is assigned to the coils. However, the test is unsuccessful if metered power is zero. In various embodiments, in case of test failure, the process assumes a default configuration and outputs a results screen in edit mode. An example of detecting phase assignment is shown in FIG. 5.

The process outputs test results (214). The installer can use a corresponding screen in the commissioning application to review the inferred configuration and edit and/or re-run the test.

The adjustment factors described herein can be used to determine correct power metering. In various embodiments, a phase adjustment factor is used as a multiplication factor on the sensed power from the coil, to obtain the correct metered power. Examples of phase adjustment factors include those determined at 1504, 1508, 1532, and 1536. Similarly, a polarity adjustment factor is used as a multiplication factor on the sensed power from the coil, to obtain the correct metered power. Examples of polarity adjustment factors include those determined at 1610, 1612, 1616, and 1618. Metered power can be obtained from the product of sensed power, phase power adjustment factor, and polarity power adjustment factor.

The various portions of the presence, phase, and polarity tests can be performed together/in sequence. The following figures (FIGS. 3-5) gives examples and additional details of the presence, phase, and polarity tests.

FIG. 3 is a flow diagram illustrating an embodiment of a process for checking for metering component presence. The process can be performed by a commissioning application 702 in cooperation with controller 714 of FIG. 7 or processor 802 of FIG. 8.

In this example, the process begins by reading the continuity of L1 and L2 coils (300). For example, the process determines continuity by using telemetry data from the circuit board. From the circuit board, the process senses if one or more coils are present on L1 (line 1) or L2 (line 2) as follows.

The process determines whether an L1 coil is present (302). That is, the process senses whether there is a coil on L1. If there is no L1 coil present, the process proceeds to check if there is an L2 coil present (308). If there is no L2 coil, then the process determines that the coil count is 0 (312). There is no coil, and the process ends. For example, an error message can be displayed in the commissioning application.

Returning to 304, if the process determines that there is an L2 coil present, then the process determines that the coil count is 1 (310) and ends. In various embodiments, having a single coil is not supported, so a message can be displayed in the commissioning application informing the installer that only one coil is sensed. Suggestions such as adding another coil or checking coil connections can be output.

Returning to 302, if there is an L1 coil present, the process proceeds to determine whether there is an L2 coil present (304). If there is no L2 coil present, then the process determines that the coil count is 1 (310) and ends as described above. Otherwise, if there is an L2 coil present, the process determines that the coil count is 2 (306) and this portion of the test passes. In various embodiments, the process can proceed to A (e.g., a phase detection portion of the test).

FIG. 4 is a flow diagram illustrating an embodiment of a process for detecting phase assignment of a metering component. The process can be performed by a commissioning application 102 in cooperation with controller 114 of FIG. 1 or processor 1102 of FIG. 11.

As further described herein, Line 1 (L1) and Line 2 (L2) can easily be confused. Although there is an L1 and L2 at the location where the installer plugs the coils in, the lines can change from the inverter (inside solar power system 180) to the energy bridge 120 to the meter with service disconnect 110. Therefore, it is difficult for the installer to actually know which is L1 and which is L2. This process for detecting phase helps to identify which line each coil is on.

In this example, the process begins by discharging a battery (e.g., in the inverter) by a pre-defined power amount on what the controller believes is L1 (400). For example, the battery is discharged at 1 kW/120V.

The process determines whether the "Coil 1" measurement changed by an expected amount (402). For the example in which the battery is discharged at 1 kW/120V, the expected change amount is 1 kW+/−5%. If "Coil 1" (the component on what the controller believed to be L1) detects the change by the expected amount (402), this indicates that the controller's initial belief is correct. The process proceeds to set "Coil 1" to "L1" with a phase adjustment factor of 1 (404). As further described with respect to FIG. 17, the phase adjustment factor can be used to determine correct power metering by using the phase adjustment factor as a multiplier on the sensed power from the coil.

However, if "Coil 1" did not detect the measurement change by the expected amount, the process proceeds to determine if "Coil 2" (the component on what the controller believed to be L2) detects the change by the expected amount (430). If "Coil 2" does not detect the change by the expected amount, then the process ends. An error message may be output. In various embodiments, if "Coil 1" and "Coil 2" both did not detect a coil present, causes may be determined and output (e.g., to the commissioning application for the installer to see). For example, this may be caused by installing the coils at a location other than the main breaker. Referring briefly to FIG. 1, if the coils are installed at Location B, when the inverter is discharged, a component at Location B will not sense this but a component at Location A will. An example output is a suggestion to check the location of where the coil was installed.

Returning to 430, if "Coil 2" (the component on what the controller believed to be L2) detects the change by the expected amount, then the process proceeds to set "Coil 2" to "L1" with a phase adjustment factor of the absolute value of the voltage on L1 divided by the voltage on L2 (432).

After 404 (where Coil 1 is set to L1), the process then discharges the battery by the pre-defined power amount on what the controller believes is L2 (406).

The process determines whether the "Coil 2" measurement changed by the expected amount (408). If "Coil 2" (the component on what the controller believed to be L2) does not detect the change by the expected amount, this indicates that the controller's initial belief is incorrect, and the process proceeds to check whether "Coil 1" (the component on what the controller believed to be L1) detects the change by the expected amount (434). If "Coil 1" does not detect the change by the expected amount, then the process ends. An appropriate error message may be displayed in the commissioning application. Otherwise, if "Coil 1" does detect the change by the expected amount, then the process proceeds to set "Coil 1" to "L2" with a phase adjustment factor of the absolute value of the voltage on L2 divided by the voltage on L1 (436).

Returning to 408, if "Coil 2" (the component on what the controller believed to be L2) detects the change by the expected amount (410), this indicates that the controller's initial belief is correct. The process proceeds to set "Coil 2" to "L2" with a phase adjustment factor of 1 (410). The process determines this portion of the test passes. In various embodiments, the process can proceed to B (e.g., a polarity detection portion of the test).

Table 2 is a summary of different coil phase scenarios and validations (test results). In various embodiments, phase measurements are measured independently, and there is an error if Coil 1 and Coil 2 are measuring the same phase.

TABLE 2

| Scenario | Coil 1 phase | Coil 2 phase | Validation |
| --- | --- | --- | --- |
| Both on phase 1 | L1 | L1 | Error |
| Default | L1 | L2 | Valid |
| Swapped | L2 | L1 | Valid |
| Both on phase 2 | L2 | L2 | Error |

FIG. 5 is a flow diagram illustrating an embodiment of a process for detecting polarity of a metering component. For example, Rogowski coil polarity can be inferred using this process. The process can be performed by a commissioning application 102 in cooperation with controller 114 of FIG. 1 or processor 1102 of FIG. 11.

Figure 7:
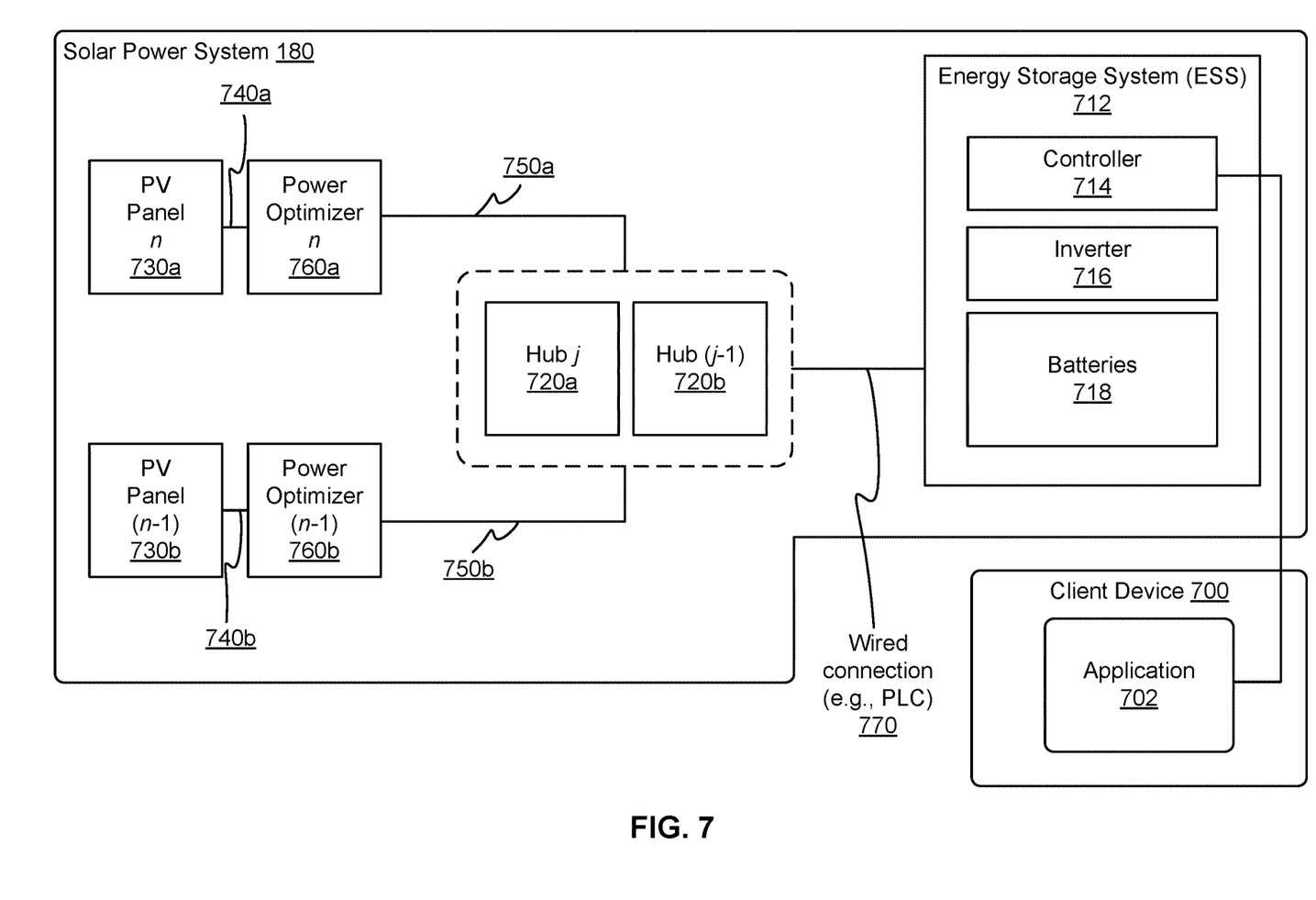
FIG. 7 is a block diagram illustrating an embodiment of a system in which metering component testing can be performed.

In this example, the process begins by turning an inverter AC output off (500). Referring briefly to FIG. 7, the AC output of inverter 716 is turned off. The process then reads a phase factor adjusted power from line 1 (L1) and/or line 2 (L2) (504). If the sum of the absolute value of the adjusted L1 power and the absolute value of the adjusted L2 power is not greater than 0 (506), then the process ends and an appropriate error message may be output. Otherwise, the process proceeds to check whether the adjusted L1 power is greater than 0 (508).

If the adjusted L1 power is not greater than 0, then the process proceeds to set the L1 polarity adjustment factor to −1 (512). This effectively corrects the phase by making the adjustment in software. Returning to 508, if the adjusted L1 power is greater than 0, then the process proceeds to set the L1 polarity adjustment factor to 1 (510). As further described with respect to FIG. 17, the polarity adjustment factor can be used to determine correct power metering by using the polarity adjustment factor as a multiplier on the sensed power from the coil.

The process then checks whether the adjusted L2 power is greater than 0 (514). If the adjusted L2 power is not greater than 0, then the process proceeds to set the L2 polarity adjustment factor to −1 (518) and ends. This effectively corrects the phase by making the adjustment in software. Returning to 514, if the adjusted L2 power is greater than 0, then the process proceeds to set the L2 polarity adjustment factor to 1 (55). The process then ends (520).

Table 3 is a summary of different coil polarity scenarios and validation (test results).

TABLE 3

| Scenario | Coil 1 polarity | Coil 2 polarity | Validation |
| --- | --- | --- | --- |
| Default | Default | Default | Valid |
| One inverted | Default | Inverted | Valid |
| Other inverted | Inverted | Default | Valid |
| Both inverted | Inverted | Inverted | Valid |

The following figures (FIGS. 6A and 6B) show some example graphical user interfaces associated with metering component testing.

Figure 6A:
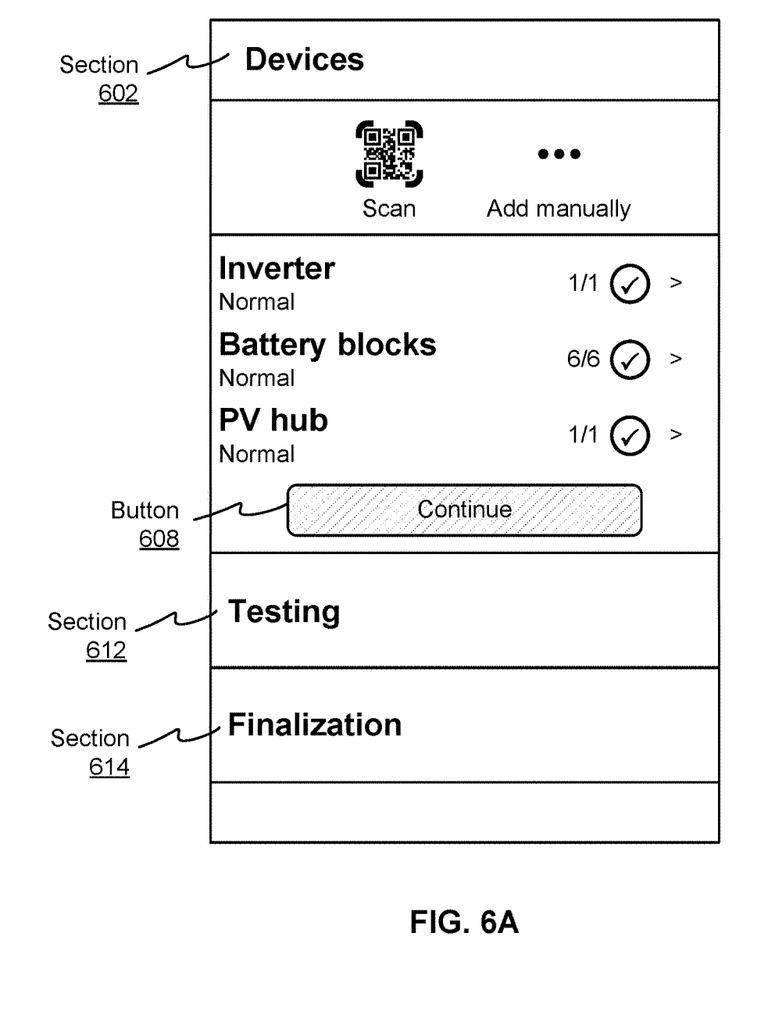
FIG. 6A shows an example of a graphical user interface for a configuration process including a testing stage according to an embodiment.

FIG. 6A shows an example of a graphical user interface for a configuration process including a testing stage according to an embodiment. In various embodiments, this screen is displayed to facilitate configuration or commissioning of a system such as solar power system 180. Configuration refers to a process by which system components are configured to function as intended. Configuration may be performed at any time. Commissioning refers to at least a portion of the configuration process that is performed to set up the system and establish communications channels. Typically, commissioning is performed once at the time of installation.

The configuration process may include one or more stages. In this example, each stage is represented by a separate section 602, 612, and 614 in the graphical user interface (GUI). The number and order of phases is merely exemplary and not intended to be limiting.

The devices section 602 provides an option for live capture (scanning of a QR code) or text entry ("Add manually"). Displayed below the entry options is a whitelist of devices. In this example, the whitelist includes one inverter, five battery blocks, and one PV hub. The number and type of devices would vary depending on the installed system. In various embodiments, any device that uses PLC can be included (e.g., inverters, PV optimizers, load controllers/hubs, etc.). Here, each of the devices have already been entered and match the expected number of devices as indicated by the checkmark circular icon. The details of each device can be viewed by selecting the arrow to the right of the corresponding device type. The user interface can reflect that an ID entered is for a specific type of device (e.g., inverter). For example, upon scanning a QR code, the user interface will update the display to show which category/type of device the device belongs to.

In various embodiments, the GUI presents a subsequent phases after condition(s) in a prior phase are met. The GUI can automatically load the next phase or the installer can select the continue button 608 to proceed to the next step in the commissioning process.

The testing section 612 allows the installer to interact with various portions of the presence, phase, and polarity tests described herein. Test results can also be displayed. The finalization section 614 corresponds to finalization portions of the configuration process such as reporting success, failure, or other status information associated with the configuration process.

Figure 6B:
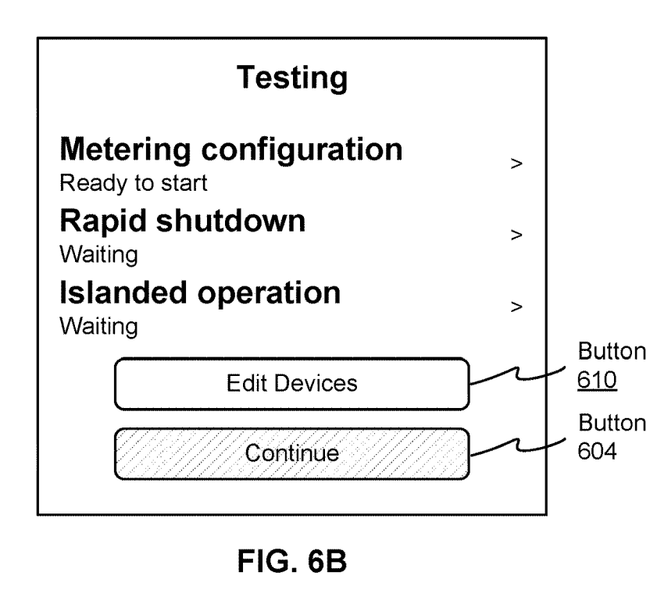
FIG. 6B shows an example of a graphical user interface for displaying testing status for a configuration process according to an embodiment.

FIG. 6B shows an example of a graphical user interface for displaying testing status for a configuration process according to an embodiment. This screen may be displayed in response to selecting section 612 of FIG. 6A or after earlier stages of the configuration process have been completed. In various embodiments, the tests can be individually performed by selecting the links (metering configuration, rapid shutdown, islanded operation) shown. Alternatively, one or more tests can be automatically performed. In various embodiments, the continue button 604 can appear or be enabled at a particular stage or set of stages. For example, the button is enabled for interaction at a testing phase. To continue to the next stage of the configuration process (e.g., finalization 614), button 1008 can be selected.

In various embodiments, at least a subset of the tests is completed in order before being able to continue. For example, in a first phase of the testing stage, the continue button 604 is disabled and cannot be actioned. After the tests have been completed in order, the button becomes enabled and can be actioned. A user can return to a prior phase, by unlocking a prior phase (e.g. by tapping the "Edit Devices" button 6110) to re-enable a devices stage 602, and disable the testing stage. The ability to lock and unlock phases may help ensure that dependencies are met.

In various embodiments, the disclosed techniques may be performed when it is determined that the installation involves a field installed accessory metering component. For example, an installer notes via a commissioning application (e.g., under an automated tests metering section such as the "metering configuration" shown here), that a partial home backup is applicable to the current installation situation. A partial home backup indicates that a field installed accessory metering component (e.g., Rogowski coils) was installed and so the phase and polarity test should be performed.

FIG. 7 is a block diagram illustrating an embodiment of a system in which metering component testing can be performed. The system includes a solar power system 180 and a client device 700 for commissioning the solar power system. The disclosed techniques may be applied to commission the example system 180 (or more generally, any electrical power system). To preserve the readability of the diagram, some connections and/or components are not necessarily shown.

The solar power system 780 includes one or more PV panels (730a and 730b), one or more power optimizers (760a and 760b), one or more hubs (720a and 720b), and an energy storage system (ESS) 712. In various embodiments, the PV panel(s), power optimizer(s), and/or hub(s) are co-located (e.g., on the roof), while the ESS is remote (e.g., in the garage).

The power optimizers (sometimes called "maximizers") are module-level power electronics that are used to control and/or manage PV panels. In various systems in which the disclosed commissioning process can be applied, the power optimizers may be included in or replaced by module-level power electronics. For simplicity, "power optimizers," "module-level power electronics," and "power electronics modules" are used interchangeably. A power optimizer adjusts the configurations of the PV panel (e.g., the voltage the PV panel is at) to optimize the power generated by the PV panel. In various embodiments, there is an array of PV panels and each PV panel has its own associated power optimizer so that each PV panel can be configured and/or optimized independently of other PV panels.

In this example, there are n power optimizers connected together in series, including the $n^{th}$ power optimizer (760a) and the $(n-1)^{th}$ power optimizer (760b). The $n^{th}$ and $(n-1)^{th}$ power optimizers (760a and 760b) are respectively connected to and correspondingly manage the $n^{th}$ and $(n-1)^{th}$ PV panels (730a and 730b). The energy generated by a given PV panel (e.g., 730a) is passed along to the rest of the system by a corresponding power optimizer (e.g., 760a). In this example, the outputs of the power optimizers (760a and 760b) are in the DC domain. The power optimizers (760a and 760b) transfer energy from the PV panels (730a and 730b) into a DC bus.

In this example, the ESS 712 includes a controller 714, inverter 716, and one or more battery modules 718. That is, the inverter, the controller, and the battery module(s) are co-located. The controller 714 (sometimes called a "home controller") can be a separate component from the inverter as shown or can be included in the inverter 716 to provide control of the inverter and/or other system components. In various embodiments, the controller is configured to communicate with an application 702 to perform the disclosed techniques to test metering components. Each battery module includes a battery storage (or any other type of energy storage as appropriate) and a DC-DC converter. In various embodiments, the inverter 716 manages the flow of electricity back and forth between a DC side (e.g., in the form of the DC bus to which DC devices are attached such as the power optimizers, the DC interface of the inverter, etc.) and an AC side (e.g., in the form of an AC bus to which AC devices are attached such as a breaker panel to the grid, the AC interface of the inverter, etc.).

One or more hubs (720a and 720b; collectively referred to as 720) are configured to facilitate communications within the solar power system. Typically, a system includes a single hub. However, this is not intended to be limiting as additional hubs can be added to expand the communications range of the hub. For example, when a subarray of optimizers is isolated and cannot communicate with the rest of the array, an additional hub can be added to provide connectivity to the subarray. An example of a hub is PV Hub by Lunar Energy, Inc.

In various embodiments, the hub wirelessly communicates with the plurality of power electronics modules via a mesh network. The hub communicates with the controller over power line communications (PLC). The hub translates the plurality of wireless mesh signals from each of the power optimizers into a wired signal for communications between the hub and the inverter. The hub can include or be included in a power combiner box or a junction box. Conventional systems typically do not include a hub. Instead, in some conventional systems, the power optimizers use wired communications such as PLC. The power optimizers send signals over a DC circuit and each individual device communicates with the inverter, which is the main controller of the system. This can be expensive because PLC communication chips are expensive. A conventional system may have 10-60 PV panels, which correspond to 10 to 60 power optimizers. In some conventional systems, power optimizers communicate wirelessly with a controller, and no wired connections are used. However, signal strength may be limited by factors such as blocking/interfering components (e.g., roofing material, attic installation, a wall of the house, other items on the roof such as satellite dishes, etc.). In some conventional systems, microinverters (instead of a central inverter) are used. The microinverter is a module-level power electronic device, so there is one device per module on the roof that communicates via PLC with a main controller.

By contrast, the disclosed system uses hybrid communications that include a wired connection 770 from a controller to a hub, a wireless connection (750a and 750b) from the hub to the power optimizers, and a wired connection (740a and 740b) from the power optimizers to the PV panels. In various embodiments, the disclosed system has a single PLC transmitter and receiver in a PV hub. The system may have a small number (e.g., one or a few) of hubs. The electronics in the hub are protected by providing them in a substantially sealed box that is weather resistant. One of the advantages of the disclosed system is a good balance between cost and performance. For example, good communications can be implemented in a cost-effective way. The disclosed commissioning process takes into account this unique architecture in which the power optimizers and hub communicate wirelessly, and the hub and controller communicate over a wired connection.

The client device 700 includes an application 702 for testing metering components. In various embodiments, the metering component test(s) can be part of another process such as a process for configuring the solar power system 180. As further described with respect to FIG. 8, the client device is a programmed computer system such as a smartphone that can be configured to perform the disclosed commissioning process. In various embodiments, a user operates the client device 700 by running the application 702 to test metering components. The user is also sometimes referred to herein as an installer since the typical user is the one who installs the solar power system 180. For example, the user downloads the application and runs the application to enable the application to cooperate with the controller 714 to perform a metering component test.

Figure 8:
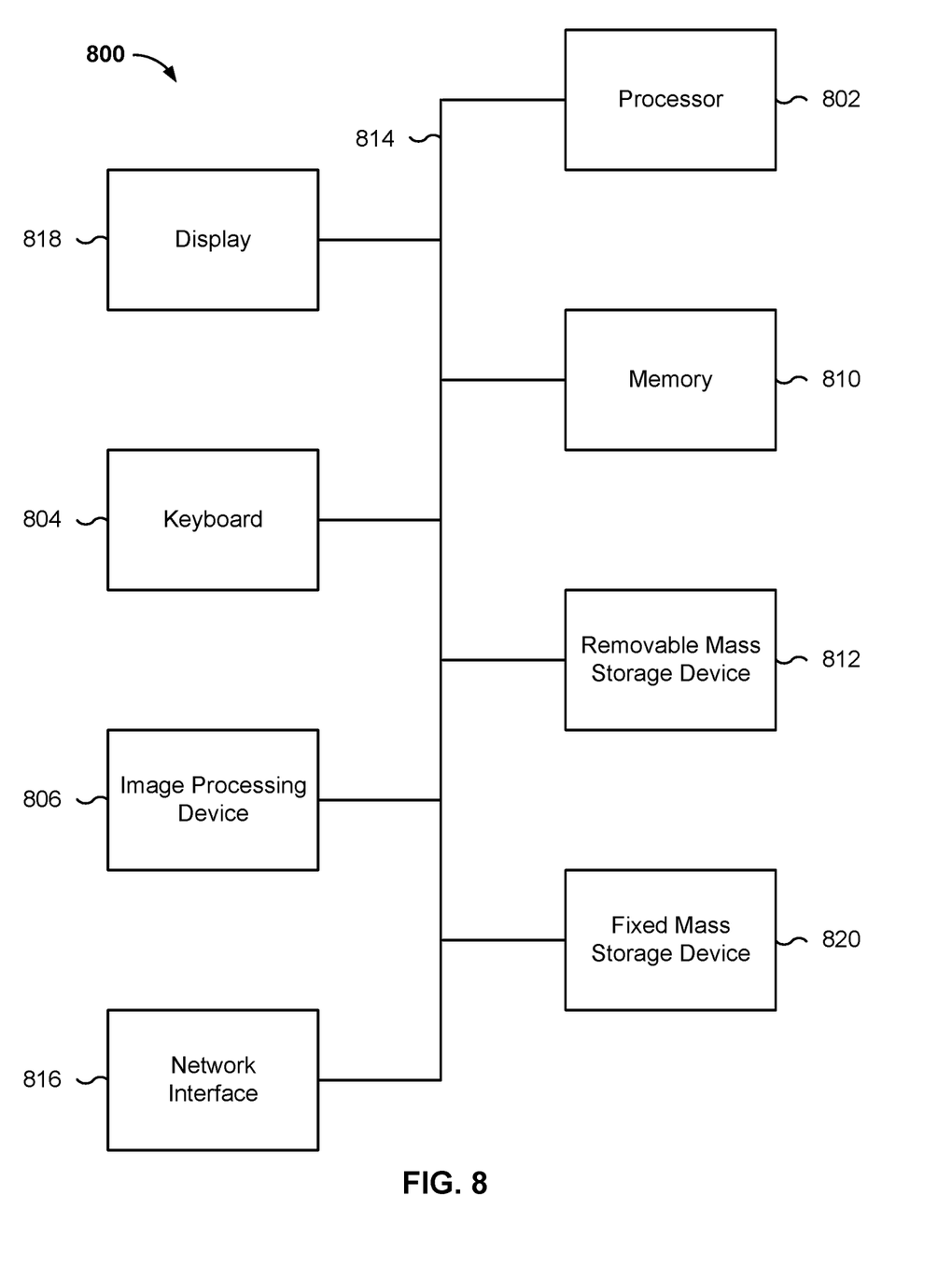
FIG. 8 is a functional diagram illustrating a programmed computer system for metering component testing in accordance with some embodiments.

FIG. 8 is a functional diagram illustrating a programmed computer system for metering component testing in accordance with some embodiments. As will be apparent, other computer system architectures and configurations can be used to perform the described testing techniques. Computer system 800, which includes various subsystems as described below, includes at least one microprocessor subsystem (also referred to as a processor or a central processing unit (CPU) 802). For example, processor 802 can be implemented by a single-chip processor or by multiple processors. In some embodiments, processor 802 is a general purpose digital processor that controls the operation of the computer system 800. In some embodiments, processor 802 also includes one or more coprocessors or special purpose processors (e.g., a graphics processor, a network processor, etc.). Using instructions retrieved from memory 810, processor 802 controls the reception and manipulation of input data received on an input device (e.g., image processing device 806, I/O device interface 804), and the output and display of data on output devices (e.g., display 818).

Processor 802 is coupled bi-directionally with memory 810, which can include, for example, one or more random access memories (RAM) and/or one or more read-only memories (ROM). As is well known in the art, memory 810 can be used as a general storage area, a temporary (e.g., scratch pad) memory, and/or a cache memory. Memory 810 can also be used to store input data and processed data, as well as to store programming instructions and data, in the form of data objects and text objects, in addition to other data and instructions for processes operating on processor 802. Also as is well known in the art, memory 810 typically includes basic operating instructions, program code, data, and objects used by the processor 802 to perform its functions (e.g., programmed instructions). For example, memory 810 can include any suitable computer readable storage media described below, depending on whether, for example, data access needs to be bi-directional or uni-directional. For example, processor 802 can also directly and very rapidly retrieve and store frequently needed data in a cache memory included in memory 810.

A removable mass storage device 812 provides additional data storage capacity for the computer system 800, and is optionally coupled either bi-directionally (read/write) or uni-directionally (read only) to processor 802. A fixed mass storage 820 can also, for example, provide additional data storage capacity. For example, storage devices 812 and/or 820 can include computer readable media such as magnetic tape, flash memory, PC-CARDS, portable mass storage devices such as hard drives (e.g., magnetic, optical, or solid state drives), holographic storage devices, and other storage devices. Mass storages 812 and/or 820 generally store additional programming instructions, data, and the like that typically are not in active use by the processor 802. It will be appreciated that the information retained within mass storages 812 and 820 can be incorporated, if needed, in standard fashion as part of memory 810 (e.g., RAM) as virtual memory.

In addition to providing processor 802 access to storage subsystems, bus 814 can be used to provide access to other subsystems and devices as well. As shown, these can include a display 818, a network interface 816, an input/output (I/O) device interface 804, an image processing device 806, as well as other subsystems and devices. For example, image processing device 806 can include a camera, a scanner, etc.; I/O device interface 804 can include a device interface for interacting with a touchscreen (e.g., a capacitive touch sensitive screen that supports gesture interpretation), a microphone, a sound card, a speaker, a keyboard, a pointing device (e.g., a mouse, a stylus, a human finger), a Global Positioning System (GPS) receiver, an accelerometer, and/or any other appropriate device interface for interacting with system 800. Multiple I/O device interfaces can be used in conjunction with computer system 800. The I/O device interface can include general and customized interfaces that allow the processor 802 to send and, more typically, receive data from other devices such as keyboards, pointing devices, microphones, touchscreens, transducer card readers, tape readers, voice or handwriting recognizers, biometrics readers, cameras, portable mass storage devices, and other computers.

The network interface 816 allows processor 802 to be coupled to another computer, computer network, or telecommunications network using a network connection as shown. For example, through the network interface 816, the processor 802 can receive information (e.g., data objects or program instructions) from another network, or output information to another network in the course of performing method/process steps. Information, often represented as a sequence of instructions to be executed on a processor, can be received from and outputted to another network. An interface card or similar device and appropriate software implemented by (e.g., executed/performed on) processor 802 can be used to connect the computer system 800 to an external network and transfer data according to standard protocols. For example, various process embodiments disclosed herein can be executed on processor 802, or can be performed across a network such as the Internet, intranet networks, or local area networks, in conjunction with a remote processor that shares a portion of the processing. Additional mass storage devices (not shown) can also be connected to processor 802 through network interface 816.

In addition, various embodiments disclosed herein further relate to computer storage products with a computer readable medium that includes program code for performing various computer-implemented operations. The computer readable medium includes any data storage device that can store data which can thereafter be read by a computer system. Examples of computer readable media include, but are not limited to: magnetic media such as disks and magnetic tape; optical media such as CD-ROM disks; magneto-optical media such as optical disks; and specially configured hardware devices such as application-specific integrated circuits (ASICs), programmable logic devices (PLDs), and ROM and RAM devices. Examples of program code include both machine code as produced, for example, by a compiler, or files containing higher level code (e.g., script) that can be executed using an interpreter.

The computer system shown in FIG. 8 is but an example of a computer system suitable for use with the various embodiments disclosed herein. Other computer systems suitable for such use can include additional or fewer subsystems. In some computer systems, subsystems can share components (e.g., for touchscreen-based devices such as smart phones, tablets, etc., I/O device interface 804 and display 818 share the touch sensitive screen component, which both detects user inputs and displays outputs to the user). In addition, bus 814 is illustrative of any interconnection scheme serving to link the subsystems. Other computer architectures having different configurations of subsystems can also be utilized.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
   obtaining a configuration associated with at least one metering component installed at a site to be metered;
   performing a metering component test including at least one of:
     detecting phase assignment of the at least one metering component based at least on the configuration including by:
       discharging a battery by a predefined power amount on a first line;
       determining whether a measurement on a first metering component changed by an expected amount;
       in response to a determination that the measurement on the first metering component did not change by the expected amount:
         determining that a measurement on a second metering component changed by the expected amount;
         determining that the second metering component is on the first line; and
         setting a phase adjustment factor for the second metering component to reflect the determination that the second metering component is on the first line;
       in response to a determination that the measurement on the first metering component changed by the expected amount:
         determining that the first metering component is on the first line;
         setting a phase adjustment factor for the first metering component to be 1;
         discharging the battery by the predefined power amount on a second line;
         determining whether the measurement on the second metering component changed by the expected amount;
       in response to a determination that the measurement on the second metering component did not change by the expected amount and a determination that the measurement on the first metering component changed by the expected amount:
         determining that the first metering component is on the second line; and
         setting a phase adjustment factor for the first metering component to reflect the determination that the first metering component is on the second line;
       in response to a determination that the measurement on the second metering component changed by the expected amount:
         determining that the second metering component is on the second line; and
         setting a phase adjustment factor for the second metering component to be 1; and
     detecting polarity of the at least one metering component based at least on the configuration; and
   outputting information associated with the metering component test.

2. The method of claim 1, wherein detecting that the at least one metering component is present includes:
   reading continuity of the first metering component and the second metering component;
   determining whether the first metering component is present;
   determining whether the second metering component is present; and
   determining a quantity of metering components present based at least on the determination of whether the first metering component is present and the determination of whether the second metering component is present.

3. The method of claim 1, further comprising:
   determining at least one adjustment factor; and
   determining correct power metering based on the at least one adjustment factor.

4. The method of claim 1, wherein the phase adjustment factor for the second metering component to reflect the determination that the second metering component is on the first line is: the absolute value of a voltage on the first line divided by a voltage on the second line.

5. The method of claim 1, wherein the phase adjustment factor for the first metering component to reflect the determination that the first metering component is: the absolute value of a voltage on the second line divided by a voltage on the first line.

6. The method of claim 1, wherein at least one of the first metering component and the second metering component includes a Rogowski coil.

7. The method of claim 1, wherein detecting polarity of the at least one metering component includes:
  turning an AC output of an inverter off;
  reading a phase factor adjusted power from a first line and a second line;
  determining that the sum of: the absolute value of the adjusted power on the first line and the absolute value of the adjusted power on the second line is greater than 0;
  in response to the determination that the sum of: the absolute value of the adjusted power on the first line and the absolute value of the adjusted power on the second line is greater than 0, determining whether the adjusted power on the first line is greater than 0;
  in response to a determination that the adjusted power on the first line is not greater than 0, flipping a polarity of the first line in software;
  in response to a determination that the adjusted power on the first line is greater than 0:
    determining whether the adjusted power on the second line is greater than 0;
    in response to a determination that the adjusted power on the second line is not greater than 0, flipping a polarity of the second line in software; and
  turning the AC output of the inverter on.

8. The method of claim 7, wherein flipping the polarity of the first line in software includes setting a polarity adjustment factor to −1 and flipping the polarity of the second line in software includes setting a polarity adjustment factor to −1.

9. The method of claim 1, wherein the site to be metered includes:
  a solar power system;
  a meter with service disconnect;
  an energy bridge; and
  at least one load.

10. The method of claim 9, wherein the solar power system includes:
  a hub configured to wirelessly communicate with a plurality of power electronics modules, wherein each of the plurality of power electronics modules of at least a portion of the plurality of power electronics modules is associated with a corresponding photovoltaic panel; and
  a controller configured to perform the metering component test, wherein the controller is physically connected to the hub and communicates with the hub via wiring that also carries power from photovoltaic panels to an inverter.

11. The method of claim 9, wherein the metering component test is included in a commissioning procedure for the solar power system.

12. The method of claim 9, wherein the at least one metering component is communicatively coupled to the meter with service disconnect and the at least one load.

13. The method of claim 1, wherein obtaining the configuration includes:
  receiving metering type information;
  determining at least one pre-requisite based at least on the received metering type information; and
  updating the determined pre-requisites based at least on user input.

14. The method of claim 13, wherein the at least one pre-requisite includes at least one of:
  the at least one metering component is present;
  at least one load at the site is on; and
  the site is ready to be energized.

15. The method of claim 1, wherein performing the metering component test includes detecting that the at least one metering component is present based at least on the configuration.

16. A system, comprising:
  a hub configured to wirelessly communicate with a plurality of power electronics modules, wherein each of the plurality of power electronics modules of at least a portion of the plurality of power electronics modules is associated with a corresponding photovoltaic panel; and
  a controller that is physically connected to the hub and communicates with the hub via wiring that also carries power from photovoltaic panels to an inverter, wherein the controller is configured to:
obtain a configuration associated with at least one metering component installed at a site to be metered;
perform a metering component test including at least one of:
  detecting phase assignment of the at least one metering component based at least on the configuration including by
    discharging a battery by a predefined power amount on a first line;
    determining whether a measurement on a first metering component changed by an expected amount;
    in response to a determination that the measurement on the first metering component did not change by the expected amount:
      determining that a measurement on a second metering component changed by the expected amount;
      determining that the second metering component is on the first line; and
      setting a phase adjustment factor for the second metering component to reflect the determination that the second metering component is on the first line;
    in response to a determination that the measurement on the first metering component changed by the expected amount:
      determining that the first metering component is on the first line;
      setting a phase adjustment factor for the first metering component to be 1;
      discharging the battery by the predefined power amount on a second line;
      determining whether the measurement on the second metering component changed by the expected amount;
    in response to a determination that the measurement on the second metering component did not change by the expected amount and a determination that the measurement on the first metering component changed by the expected amount:
      determining that the first metering component is on the second line; and
      setting a phase adjustment factor for the first metering component to reflect the determination that the first metering component is on the second line;
    in response to a determination that the measurement on the second metering component changed by the expected amount:
      determining that the second metering component is on the second line; and setting a phase adjustment factor for the second metering component to be 1; and detecting polarity of the at least one metering component based at least on the configuration; and output information associated with the metering component test.

17. The system of claim 16, wherein at least one of the first metering component and the second metering component includes a Rogowski coil.

18. A computer program product embodied in a non-transitory computer readable medium and comprising computer instructions for:

obtaining a configuration associated with at least one metering component installed at a site to be metered;

performing a metering component test including at least one of:

detecting phase assignment of the at least one metering component based at least on the configuration including by:

discharging a battery by a predefined power amount on a first line;

determining whether a measurement on a first metering component changed by an expected amount;

in response to a determination that the measurement on the first metering component did not change by the expected amount:

determining that a measurement on a second metering component changed by the expected amount;

determining that the second metering component is on the first line; and setting a phase adjustment factor for the second metering component to reflect the determination that the second metering component is on the first line;

in response to a determination that the measurement on the first metering component changed by the expected amount:

determining that the first metering component is on the first line;

setting a phase adjustment factor for the first metering component to be 1;

discharging the battery by the predefined power amount on a second line;

determining whether the measurement on the second metering component changed by the expected amount;

in response to a determination that the measurement on the second metering component did not change by the expected amount and a determination that the measurement on the first metering component changed by the expected amount:

determining that the first metering component is on the second line; and setting a phase adjustment factor for the first metering component to reflect the determination that the first metering component is on the second line;

in response to a determination that the measurement on the second metering component changed by the expected amount:

determining that the second metering component is on the second line; and setting a phase adjustment factor for the second metering component to be 1; and detecting polarity of the at least one metering component based at least on the configuration; and outputting information associated with the metering component test.

19. The computer program product of claim 18, wherein detecting that the at least one metering component is present includes:

reading continuity of the first metering component and the second metering component;

determining whether the first metering component is present;

determining whether the second metering component is present; and determining a quantity of metering components present based at least on the determination of whether the first metering component is present and the determination of whether the second metering component is present.

20. The computer program product of claim 18, further comprising:

determining at least one adjustment factor; and determining correct power metering based on the at least one adjustment factor.

* * * * *

UNITED STATES PATENT AND TRADEMARK OFFICE
CERTIFICATE OF CORRECTION

PATENT NO. : 11,953,577 B1
APPLICATION NO. : 18/212926
DATED : April 9, 2024
INVENTOR(S) : Kyle Breuning Evans, Sebastian Wolf and César Pecharromán Arribas

Page 1 of 1

It is certified that error appears in the above-identified patent and that said Letters Patent is hereby corrected as shown below:

On the Title Page

Column 1, item (72), Inventors, after "(GB)", insert --; César Pecharromán Arribas, Winchester (GB)--, therefor.

Signed and Sealed this
Eighth Day of October, 2024

Katherine Kelly Vidal
*Director of the United States Patent and Trademark Office*